(12) United States Patent
Kim

(10) Patent No.: US 12,302,574 B2
(45) Date of Patent: May 13, 2025

(54) SEMICONDUCTOR MEMORY DEVICE AND METHOD FOR FABRICATING THE SAME

(71) Applicant: SK hynix Inc., Icheon-si Gyeonggi-do (KR)

(72) Inventor: Young Rok Kim, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 756 days.

(21) Appl. No.: 17/347,195

(22) Filed: Jun. 14, 2021

(65) Prior Publication Data
US 2022/0254792 A1 Aug. 11, 2022

(30) Foreign Application Priority Data

Feb. 5, 2021 (KR) .................. 10-2021-0016744

(51) Int. Cl.
H10B 43/35 (2023.01)
H01L 23/528 (2006.01)
H10B 41/10 (2023.01)
H10B 41/27 (2023.01)
H10B 41/35 (2023.01)
H10B 43/10 (2023.01)
H10B 43/27 (2023.01)

(52) U.S. Cl.
CPC .......... H10B 43/35 (2023.02); H01L 23/528 (2013.01); H10B 41/10 (2023.02); H10B 41/27 (2023.02); H10B 41/35 (2023.02); H10B 43/10 (2023.02); H10B 43/27 (2023.02)

(58) Field of Classification Search
CPC ........ H10B 43/35; H10B 41/10; H10B 41/27; H10B 41/35; H10B 43/10; H10B 43/27; H10B 43/50; H10B 41/50; H01L 23/528
See application file for complete search history.

(56) References Cited

U.S. PATENT DOCUMENTS

| | | | |
|---|---|---|---|
| 10,483,124 B2 | 11/2019 | Sawano et al. | |
| 2012/0052674 A1* | 3/2012 | Lee | H10B 43/20 257/E21.645 |
| 2012/0119283 A1* | 5/2012 | Lee | H10B 41/20 257/314 |
| 2012/0119287 A1* | 5/2012 | Park | H10B 43/27 257/329 |
| 2014/0248766 A1* | 9/2014 | Shim | H10B 41/27 438/618 |
| 2014/0284695 A1* | 9/2014 | Won | H01L 29/42344 257/324 |
| 2015/0137216 A1* | 5/2015 | Lee | H01L 29/7889 257/329 |
| 2015/0287710 A1* | 10/2015 | Yun | H10B 43/35 257/314 |

(Continued)

Primary Examiner — Bitew A Dinke
(74) Attorney, Agent, or Firm — WILLIAM & ASSOCIATES LTD.

(57) ABSTRACT

A semiconductor memory device includes: a gate electrode stack vertically stacked over a substrate with bent gate pads, the bent gate pads portion of the gate electrode stack having a step-shaped structure; an inter-layer dielectric layer covering the bent gate pads; and a plurality of contact plugs respectively coupled to the bent gate pads by penetrating the inter-layer dielectric layer, wherein the bent gate pads include angled corner portions of different sizes.

13 Claims, 14 Drawing Sheets

(56) References Cited

U.S. PATENT DOCUMENTS

| | | | |
|---|---|---|---|
| 2016/0093634 A1* | 3/2016 | Jang | H01L 29/495 |
| | | | 257/324 |
| 2016/0133644 A1* | 5/2016 | Lee | H10B 41/27 |
| | | | 257/314 |
| 2017/0103993 A1* | 4/2017 | Lee | H10B 43/35 |
| 2017/0179025 A1* | 6/2017 | Yun | H10B 43/10 |
| 2017/0207221 A1* | 7/2017 | Kim | H10B 43/27 |
| 2017/0323899 A1* | 11/2017 | Park | H10B 43/27 |
| 2018/0130700 A1* | 5/2018 | Ha | H10B 99/00 |
| 2018/0211968 A1* | 7/2018 | Lee | H01L 23/528 |
| 2018/0336950 A1* | 11/2018 | Jeong | H01L 21/76816 |
| 2019/0043876 A1* | 2/2019 | van Schravendijk | |
| | | | G11C 16/0408 |
| 2019/0081059 A1 | 3/2019 | Xu et al. | |
| 2019/0237477 A1* | 8/2019 | Baek | H10B 43/10 |
| 2019/0393241 A1* | 12/2019 | Baek | H01L 29/40117 |
| 2020/0006377 A1* | 1/2020 | Chu | H10B 43/27 |
| 2020/0105783 A1 | 4/2020 | Baek | |
| 2020/0395372 A1* | 12/2020 | Seo | H10B 41/27 |
| 2020/0402994 A1* | 12/2020 | Yang | H10B 43/27 |
| 2021/0242128 A1* | 8/2021 | Ito | H10B 43/10 |
| 2021/0391260 A1* | 12/2021 | Lee | H10B 43/27 |

* cited by examiner

SEMICONDUCTOR MEMORY DEVICE AND METHOD FOR FABRICATING THE SAME

CROSS-REFERENCE TO RELATED APPLICATIONS

The present application claims priority of Korean Patent Application No. 10-2021-0016744, filed on Feb. 5, 2021, which is incorporated herein by reference in its entirety.

BACKGROUND

1. Field

Exemplary embodiments of the present invention relate to a semiconductor device, and more particularly, to a semiconductor memory device and a method for fabricating the semiconductor memory device.

2. Description of the Related Art

More and more, technology requires improvements to the degree of integration of semiconductor devices in order to achieve excellent performance and low price, which are demanded by consumers. In the case of a semiconductor device, a particularly increased degree of integration is demanded because the degree of integration is an important factor in determining the price of a product. To cope with the demand, three-dimensional semiconductor memory devices with memory cells that are arranged three-dimensionally are being proposed.

SUMMARY

In accordance with an embodiment of the present invention, a semiconductor memory device includes: a gate electrode stack vertically stacked over a substrate with bent gate pads, the bent gate pads of the gate electrode stack having a step-shaped structure; an inter-layer dielectric layer covering the bent gate pads; and a plurality of contact plugs respectively coupled to the bent gate pads by penetrating the inter-layer dielectric layer, wherein the bent gate pads include angled corner portions of different sizes.

In accordance with another embodiment of the present invention, a semiconductor memory device includes: a substrate; an alternating stack in which a plurality of dielectric layers and a plurality of conductive layers are alternately stacked in a direction perpendicular to a surface of the substrate; a step-shaped trench penetrating the alternating stack, the step-shaped trench including a plurality of trenches that extend vertically toward the substrate; and an inter-layer dielectric layer filling the step-shaped trench, wherein the plurality of trenches include angled corner portions of different sizes.

In accordance with yet another embodiment of the present invention, a method for fabricating a semiconductor memory device includes: forming an alternating stack in which a plurality of sacrificial layers and a plurality of dielectric layers are alternately stacked over a substrate; forming a step-shaped trench that penetrates the alternating stack, the step-shaped trench including a plurality of trenches with angled corner portions of different sizes; forming an inter-layer dielectric layer that fills the step-shaped trench; and replacing the sacrificial layers with conductive layers.

In accordance with yet another embodiment of the present invention, a semiconductor memory device includes: a gate electrode stack vertically stacked over a substrate with bent gate pads, the bent gate pads of the gate electrode stack with a step-shaped structure; an inter-layer dielectric layer covering the bent gate pads; and a plurality of contact plugs respectively coupled to the bent gate pads by penetrating the inter-layer dielectric layer, wherein the bent gate pads include concaved corner portions of different sizes.

DETAILED DESCRIPTION

Figure 1A:
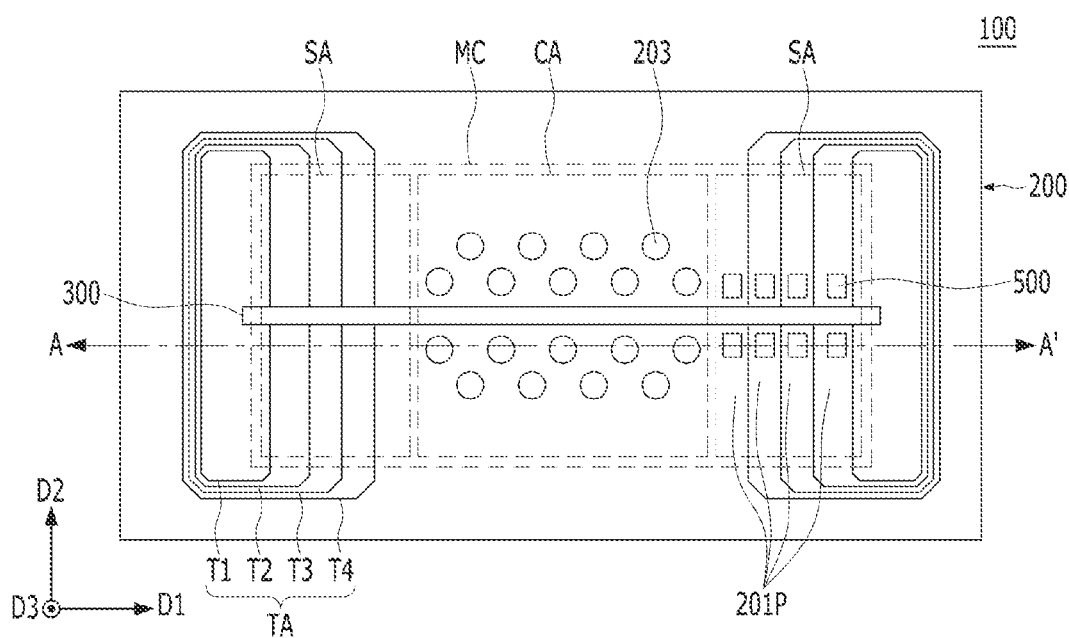
FIG. 1A is a layout diagram schematically illustrating a semiconductor memory device in a plane view.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Embodiments of the present invention are directed to a semiconductor memory device with improved reliability and a method for fabricating the semiconductor memory device.

Figure 1B:
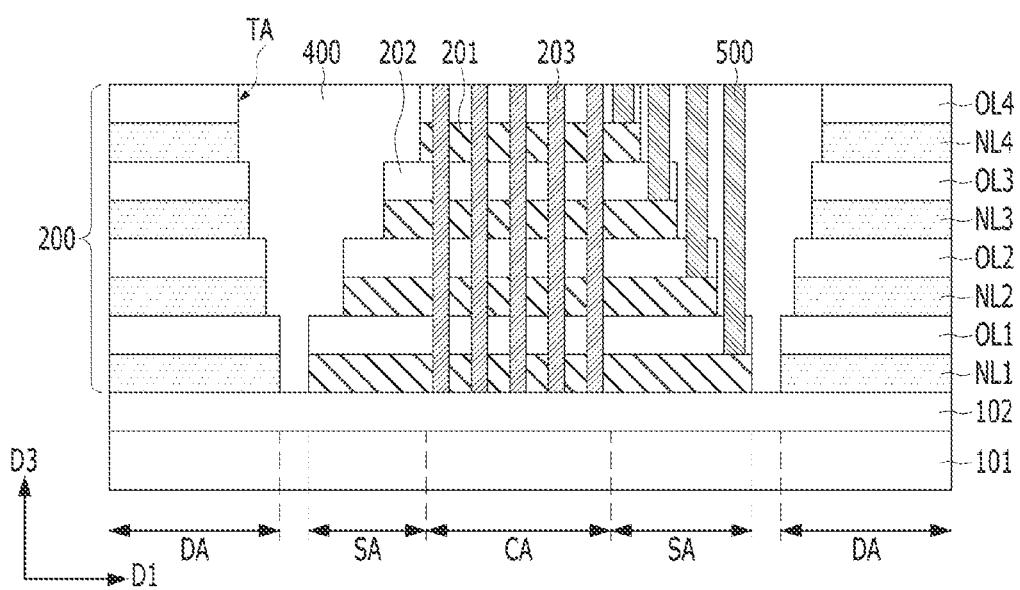
FIG. 1B is a detailed cross-sectional view taken along a line A-A' of FIG. 1A.

FIG. 1A is a layout diagram schematically illustrating a semiconductor memory device in a plan view. FIG. 1B is a detailed cross-sectional view taken along a line A-A' of FIG.

Figure 1C:
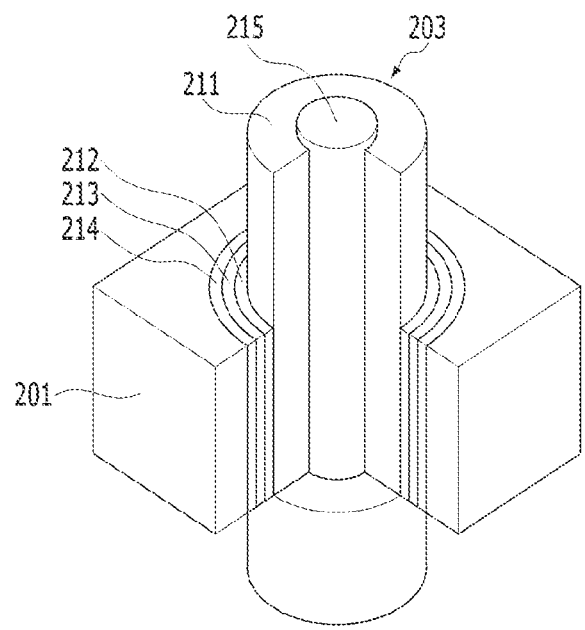
FIG. 1C is a schematic perspective view of a vertical channel structure shown in FIG. 1B.

1A. FIG. 1C is a schematic perspective view of a vertical channel structure shown in FIG. 1B.

Referring to FIGS. 1A to 1C, the semiconductor memory device 100 may include a vertical three-dimensional (3D) NAND. The semiconductor memory device 100 may include a substrate 101, a buffer layer 102 over the substrate 101, an alternating stack 200 over the buffer layer 102, and step-shaped trenches TA that vertically penetrates the alternating stack 200.

The substrate 101 may be a material that is appropriate for semiconductor processing. The substrate 101 may include a semiconductor substrate. For example, the substrate 101 may include a silicon substrate, a monocrystalline silicon substrate, a polysilicon substrate, an amorphous silicon substrate, a silicon germanium substrate, a monocrystalline silicon germanium substrate, a polycrystalline silicon germanium substrate, a carbon-doped silicon substrate, a combination thereof, or a multi-layer thereof. The substrate 101 may also include another semiconductor material, such as germanium. The substrate 101 may include a III/V-group semiconductor substrate, for example, a compound semiconductor substrate such as GaAs. The substrate 101 may include a Silicon-On-Insulator (SOI) substrate. The buffer layer 102 may include a dielectric material, such as silicon oxide.

The alternating stack 200 may include a cell array area MC and a dummy area DA. The cell array area MC may include step-shaped areas SA and a central area CA between the step-shaped areas SA. The step-shaped areas SA may be defined by step-shaped trenches TA. The step-shaped trenches TA may include a plurality of trenches T1, T2, T3, and T4. The central area CA may be disposed between the step-shaped areas SA in a first direction D1, and the step-shaped trenches TA may extend in a second direction D2.

The cell array area MC of the alternating stack 200 may include a gate electrode stack, and the gate electrode stack may include a plurality of dielectric layers 202 and a plurality of gate electrodes 201 that are stacked alternately in a third direction D3. The cell array area MC may be divided into a plurality of cell areas (or cell strings) by a slit 300 that extends in the first direction D1. The slit 300 may include a dielectric material, and both ends of the slit 300 may partially intersect with the step-shaped trench TA. According to another embodiment of the present invention, both ends of the slit 300 may divide the step-shaped trench TA in the first direction D1.

In the central area CA of the cell array area MC, a plurality of dielectric layers 202 and a plurality of gate electrodes 201 may alternate, and the dielectric layers 202 and the gate electrodes 201 may extend from the central area CA to the step-shaped areas SA. In the step-shaped areas SA, edges of the gate electrodes 201, that is, the gate pads 201P, may be positioned. The gate pads 201P may have a step-shaped structure in which the gate pads 201P are vertically stacked in the third direction D3.

The cell array area MC may further include a plurality of vertical channel structures 203 that penetrate the central area CA. Referring to FIG. 1C, the vertical channel structure 203 may penetrate the alternating stack 200 that includes the gate electrodes 201 and the dielectric layers 202. The vertical channel structure 203 may include a vertical channel layer 211, a tunnel dielectric layer 212, a charge trapping layer 213, and a blocking layer 214. A core dielectric layer 215 may be formed inside the vertical channel layer 211. The blocking layer 214 may include silicon oxide, a high-k material, or a combination thereof. For example, the blocking layer 214 may include silicon oxide, aluminum oxide, hafnium oxide, zirconium oxide, or a combination thereof. The charge trapping layer 213 may include a charge trapping dielectric material, such as silicon nitride. The charge trapping layer 213 may be conformally formed over the blocking layer 214. The tunnel dielectric layer 212 may include silicon oxide. A vertical channel layer 211 may be formed over the tunnel dielectric layer 212. The vertical channel layer 211 may include a semiconductor material. For example, the vertical channel layer 211 may include one of a polycrystalline semiconductor material, an amorphous semiconductor material, and a monocrystalline semiconductor material. The channel layer 211 may include silicon (Si), germanium (Ge), silicon germanium (SiGe), a group III-V compound, or a group II-VI compound. The channel layer 211 may include polysilicon. At least one or more other layers including a core dielectric layer 215 may be further formed over the channel layer 211.

Contact plugs 500 may land on the gate pads 201P that are disposed in the step-shaped area SA. The contact plugs 500 may penetrate an inter-layer dielectric layer 400 and may be respectively coupled to the gate pads 201P of the step-shaped area SA. The step-shaped area SA that is provided by the step-shaped trench TA may have a step-shaped structure whose length gradually increases going from the uppermost gate pad 201P to the lowermost gate pad 201P. The inter-layer dielectric layer 400 may fill the step-shaped trench TA, and the gate pads 201P of the step-shaped area SA may be covered with the inter-layer dielectric layer 400.

The gate pads 201P of the step-shaped area SA may be defined by a step-shaped trench TA. The step-shaped trench TA may have a smaller width in the first direction D1 than a width in the second direction D2.

The dummy area DA of the alternating stack 200 may be spaced apart from the step-shaped area SA by the step-shaped trenches TA. In the dummy area DA, dielectric layers OL1 to OL4 and sacrificial layers NL1 to NL4 may be alternately stacked. According to another embodiment of the present invention, the sacrificial layers NL1 to NL4 in the dummy area DA may be replaced with the same materials as the gate electrodes 201 in the central area CA.

The step-shaped trenches TA may include a plurality of trenches T1 to T4, respectively. The trenches T1 to T4 may form integrated step-shaped trenches TA that extend in a depth direction, that is, the third direction D1, toward the substrate 101. The trenches T1 to T4 may have different widths and the widths of the trenches T1 to T4 may gradually increase as it goes from the lowest trench T1 to the highest trench T4. For example, the trenches T1 to T4 may be multi-level trenches with a first trench T1, a second trench T2, a third trench T3, and a fourth trench T4. The second trench T2 may be positioned at a higher level than the first trench T1, and the third trench T3 may be positioned at a higher level than the second trench T2. The fourth trench T4 may be positioned at a higher level than the third trench T3. The lowermost first trench T1 may have the smallest width, and the uppermost fourth trench T4 may have the largest width.

Figure 2A:
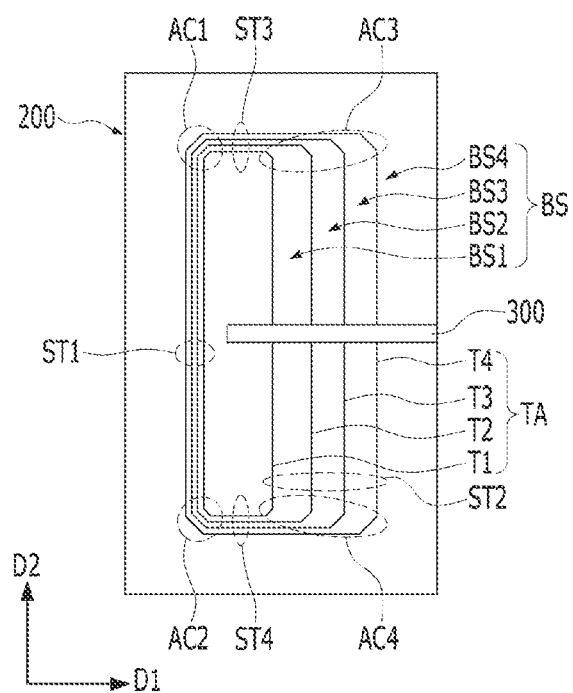
FIG. 2A is a detailed view of a step-shaped trench in a plane view.
Figure 2B:
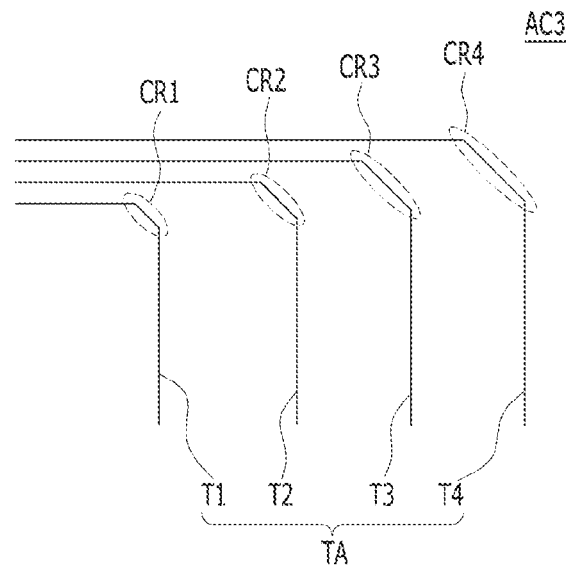
FIG. 2B illustrates corners of a step-shaped trench in detail in a plane view.

FIG. 2A is a detailed view of a step-shaped trench in a plane view. FIG. 2B illustrates corners of a step-shaped trench in detail in a plane view. In FIGS. 2A and 2B, the slit 300 will be omitted for the sake of convenience in description.

The trenches T1 to T4 of the step-shaped trench TA may provide a plurality of step-shaped sidewalls ST1, ST2, ST3, and ST4. The step-shaped sidewalls ST1, ST2, ST3, and ST4 may include a plurality of steps moving downward toward the substrate 101. The step-shaped sidewalls ST1, ST2, ST3, and ST4 may be interconnected to each other. The first step-shaped sidewall ST1 and the second step-shaped sidewall ST2 may face each other in a first direction D1, and the third step-shaped sidewall ST3 and the fourth step-shaped sidewall ST4 may face each other in a second direction D2. The second step-shaped sidewall ST2 may be divided by the slit 300.

The first step-shaped sidewall ST1 and the second step-shaped sidewall ST2 may have an asymmetric slope. The steps of the first step-shaped sidewall ST1 may descend with a steeper slope than the steps of the second step-shaped sidewall ST2. The steps of the second step-shaped sidewall ST2 may descend with a smoother slope than the steps of the first step-shaped sidewall ST1. The occupied area of the second step-shaped sidewall ST2 may be larger than that of the first step-shaped sidewall ST1.

The third step-shaped sidewall ST3 and the fourth step-shaped sidewall ST4 may have a symmetrical slope. The steps of the third step-shaped sidewall ST3 and the steps of the fourth step-shaped sidewall ST4 may descend with a steep slope. The first step-shaped sidewall ST1, the third step-shaped sidewall ST3, and the fourth step-shaped sidewall ST4 may have the same slope. The steps of the second step-shaped sidewall ST2 may have a larger surface area than the steps of the first step-shaped sidewall ST1, the third step-shaped sidewall ST3, and the fourth step-shaped sidewall ST4.

The first step-shaped sidewall ST1, the second step-shaped sidewall ST2, the third step-shaped sidewall ST3, and the fourth step-shaped sidewall ST4 may be coupled to each other to form a bent step-shaped sidewall. The coupling portions of the first step-shaped sidewall ST1, the second step-shaped sidewall ST2, the third step-shaped sidewall ST3, and the fourth step-shaped sidewall ST4 may be bent to have an angle.

The gate pads 201P that are stacked in the third direction D3 by the bent step-shaped sidewall may result in a stack of the bent steps BS1 to BS4.

The step-shaped trench TA may include four angled sidewalls AC1, AC2, AC3, and AC4. For example, as illustrated in FIG. 2B, the angled sidewall AC3 of the step-shaped trench TA may include a plurality of angled corner portions CR1, CR2, CR3, and CR4. Just like the angled sidewall AC3, each of the remaining angled sidewalls AC1, AC2, and AC4 may also include angled corner portions CR1, CR2, CR3, and CR4. The angled corner portions CR1, CR2, CR3, and CR4 may include angled corners, but they may have a non-curved shape. The angled corner portions CR1, CR2, CR3, and CR4 might not be of a right angle.

The first trench T1 may include a first angled corner portion CR1, and the second trench T2 may include a second angled corner portion CR2. The third trench T3 may include a third angled corner portion CR3, and the fourth trench T4 may include a fourth angled corner portion CR4. The angled corner portions CR1, CR2, CR3, and CR4 might not overlap with each other in a depth direction of the step-shaped trench TA.

The trenches T1, T2, T3, and T4 may have angled corner portions CR1, CR2, CR3, and CR4 with different sizes. For example, the angled corner portions CR1, CR2, CR3, and CR4 may have different lengths, but the length may gradually decrease as it goes from the uppermost fourth trench T4 (the angled corner portion CR4) to the lowermost first trench T1 (the angled corner portion CR1). Since the length of the uppermost angled corner portion CR4 is large, the formation of a seam may be further prevented in the inter-layer dielectric layer 400. Each of the angled corner portions CR1, CR2, CR3, and CR4 may have an obtuse angle or an acute angle. According to the embodiment of the present invention, the angled corner portions CR1, CR2, CR3, and CR4 may have an obtuse angle.

Hereinafter, the angled corner portion CR1 will be described in detail by taking the first trench T1 as an example.

Figure 2C:
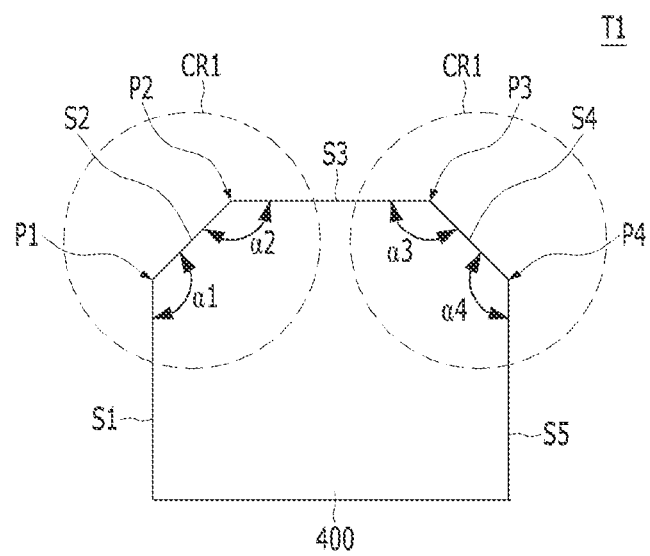
FIG. 2C is a plan view illustrating an angled corner portion of a trench.

FIG. 2C is a plan view illustrating an angled corner portion of a trench, and the angled corner portion CR1 of the first trench T1 is taken as an example and described.

Referring to FIG. 2C, The first trench T1 may include a plurality of angled corner portions CR1, and the inside of the first trench T1 may be filled with the inter-layer dielectric layer 400. The angled corner portions CR1 may be provided by a plurality of sides S1 to S5. The first side S1 and the second side S2 may come in contact at a first angle $\alpha 1$, and the second side S2 and the third side S3 may come in contact at a second angle $\alpha 2$. The third side S3 and the fourth side S4 may come in contact at a third angle $\alpha 3$, and the fourth side S4 and the fifth side S5 may come in contact at a fourth angle $\alpha 4$. All of the first to fourth angles $\alpha 1$ to $\alpha 4$ may be obtuse angles, and they may be the same angle. According to another embodiment of the present invention, the first to fourth angles $\alpha 1$ to $\alpha 4$ may be different obtuse angles.

A first angled corner P1 with a first angle $\alpha 1$ may be formed between the first side S1 and the second side S2, and a second angled corner P2 with a second angle $\alpha 2$ may be formed between the second side S2 and the third side S3. A third angled corner P3 with a third angle $\alpha 1$ may be formed between the third side S3 and the fourth side S4, and a fourth angled corner P4 with a fourth angle $\alpha 4$ may be formed between the fourth side S4 and the fifth side S5.

As described above, the angled corner portions CR1 of the first trench T1 may include a plurality of angled corners P1 to P4 with an obtuse angle.

Figure 3A:
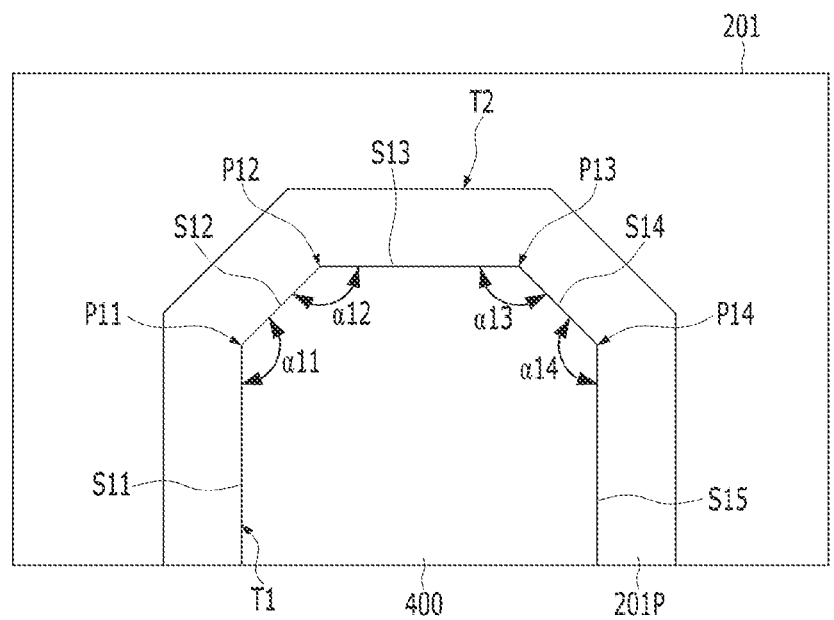
FIG. 3A is a plan view illustrating a lowermost gate electrode and a gate pad.

FIG. 3A is a plan view illustrating the lowermost gate electrode and a gate pad, and the lowermost gate electrode 201 may include a gate pad 201P. The size of the gate pad 201P may be defined by a distance between the first trench T1 and the second trench T2. The gate pad 201P may correspond to the bent step BS1 shown in FIG. 2A.

The sidewall of the gate pad 201P may include a plurality of sides S11 to S15 that contact the inter-layer dielectric layer 400. The first side S11 and the second side S12 may come in contact at a first angle $\alpha 11$, and the second side S12 and the third side S13 may come in contact at a second angle $\alpha 12$. The third side S13 and the fourth side S14 may come in contact at a third angle $\alpha 13$, and the fourth side S14 and the fifth side S15 may come in contact at a fourth angle $\alpha 14$. All of the first to fourth angles $\alpha 11$ to $\alpha 14$ may be obtuse angles, and they may be the same angles. According to another embodiment of the present invention, the first to fourth angles $\alpha 11$ to $\alpha 14$ may be different obtuse angles.

A first angled corner P11 with a first angle $\alpha 11$ may be formed between the first side S11 and the second side S12, and a second angled corner P12 with a second angle $\alpha 12$ may be formed between the second side S12 and the third side S13. A third angled corner P13 with a third angle $\alpha 11$ may be formed between the third side S13 and the fourth side S14, and a fourth angled corner P14 with a fourth angle $\alpha 14$ may be formed between the fourth side S14 and the fifth side S15.

As above, the sidewall of the gate pad 201P may include angled corners P11 to P14 with a plurality of obtuse angles. The angled corners P11 to P14 of the gate pad 201P may be defined by the angled corners P1 to P4 of the first trench T1.

Referring back to FIGS. 2C and 3A, the first to fourth angles α1 to α4 of the angled corners P1 to P4 of the first trench T1 may be the same as the first to fourth angles α11 to α14 of the angled corners P11 to P14 of the gate pad 201P.

Figure 3B:
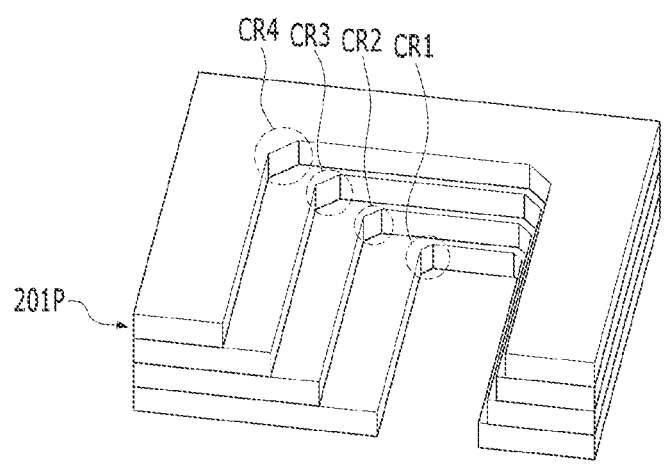
FIG. 3B is a partial perspective view illustrating a stack of gate pads.

FIG. 3B is a partial perspective view illustrating a stack of gate pads. Referring to FIG. 3B, each of the gate pads 201P may be a bent step, and the sidewalls of the gate pads 201P may include angled corner portions CR1 to CR4. The angled corner portions CR1 to CR4 may have different lengths. For example, the length may gradually decrease as it goes from the uppermost gate pad 201P (the angled corner portion CR4) to the lowermost gate pad 201P (the angled corner portion CR1).

As described above, in this embodiment, angled sidewalls AC1, AC2, AC3, and AC4 of the step-shaped trench TA that defines the step-shaped areas SA may be formed to be angled, and thus, each of the angled sidewalls AC1, AC2, AC3, and AC4 of the step-shaped trench TA may have angled corner portions CR1, CR2, CR3, and CR4. The angled corner portions CR1, CR2, CR3, and CR4 may be obtained by changing the shape of an opening of the photoresist pattern during a slimming process. The opening of the photoresist pattern will be described later with reference to FIGS. 5A to 5D.

The formation of a seam may be suppressed when the inter-layer dielectric layer 400 is deposited by the angled corners CR1, CR2, CR3, and CR4 of the step-shaped trench TA. Also, since the size gradually decreases as it goes from the uppermost angled corner portion CR4 to the lowermost angled corner portion CR1, the formation of a seam may be further suppressed in the inter-layer dielectric layer 400.

FIGS. 4A to 4M are cross-sectional views illustrating an example of a method for fabricating a semiconductor memory device in accordance with an embodiment of the present invention. FIGS. 5A to 5D are plan views of photoresist patterns used for slimming and etching processes. FIGS. 4A to 4M illustrate a fabrication method by presenting cross-sections that are taken along a line A-A' of FIG. 1A.

Figure 4A:
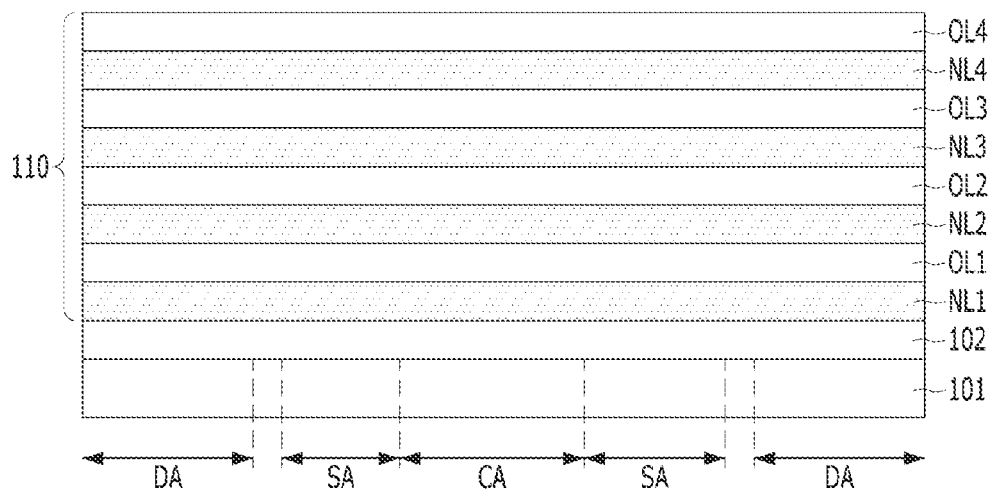
FIGS. 4A to 4M are cross-sectional views illustrating an example of a method for fabricating a semiconductor memory device in accordance with an embodiment of the present invention.

As illustrated in FIG. 4A, a buffer layer 102 may be formed over the substrate 101, and an alternating stack 110 may be formed over the buffer layer 102.

The substrate 101 may include a central area CA, step-shaped areas SA, and dummy areas DA. The substrate 101 may be of a material appropriate for semiconductor processing. The substrate 101 may include a semiconductor substrate. For example, the substrate 101 may include a silicon substrate, a monocrystalline silicon substrate, a polysilicon substrate, an amorphous silicon substrate, a silicon germanium substrate, a monocrystalline silicon germanium substrate, a polycrystalline silicon germanium substrate, a carbon-doped silicon substrate, a combination thereof, or a multi-layer thereof. The substrate 101 may also include another semiconductor material, such as germanium. The substrate 101 may include a III/V-group semiconductor substrate, for example, a compound semiconductor substrate, such as GaAs. The substrate 101 may include a Silicon-On-Insulator (SOI) substrate. Although not illustrated, a peripheral circuit may be formed between the substrate 101 and the alternating stack 110. The peripheral circuit may be formed by using, for example, a known method for forming a semiconductor circuit. After the peripheral circuit is formed, the alternating stack 110 may be formed. The buffer layer 102 may include a dielectric material or an etch stop material. The buffer layer 102 may include silicon oxide.

The alternating stack 110 may be a stacked body, and a first material layer and a second material layer may be alternately stacked. The first material layers may include a first material, and the second material layers may include a second material. The first material and the second material may be different materials. The first material layers may include sacrificial layers NL1 to NL4, and the second material layers may include dielectric layers OL1 to OL4. The dielectric layers OL1 to OL4 may include a dielectric material, and the sacrificial layers NL1 to NL4 may include a sacrificial material. Here, the 'sacrificial material' may refer to a material that is removed in the subsequent process. In the alternating stack 110, the sacrificial layers NL1 to NL4 and the dielectric layers OL1 to OL4 may be alternately stacked.

The dielectric layers OL1 to OL4 may include at least one dielectric material among silicon oxide, silicon nitride, silicon oxynitride, spin-on dielectric material (SOD), a dielectric metal oxide, silicate, and a dielectric metal oxynitride.

The sacrificial layers NL1 to NL4 may include a sacrificial material that may be selectively removed. The ratio of the removal rate of the sacrificial layers NL1 to NL4 and the removal rate of the dielectric layers OL1 to OL4 may be referred to as the selectivity of the removal process of the sacrificial layers NL1 to NL4 with respect to the dielectric layers OL1 to OL4.

The sacrificial layers NL1 to NL14 may include a sacrificial material. The sacrificial layers NL1 to NL4 may be replaced with a conductive material in the subsequent process. For example, it may be replaced with a gate electrode of a vertical NAND device. The sacrificial layers NL1 to NL4 may include silicon nitride, amorphous silicon, or polysilicon. According to some embodiments of the present invention, the sacrificial layers NL1 to NL4 may include silicon nitride.

According to the embodiment of the present invention, the dielectric layers OL1 to OL4 may include silicon oxide, and the sacrificial layers NL1 to NL4 may include silicon nitride. In the alternating stack 110, a stack of silicon nitride and silicon oxide, that is, an NO stack, may be repeatedly stacked several times. When the buffer layer 102 includes silicon oxide, the buffer layer 102 and the alternating stack 110 may be referred to as an ON stack.

In the alternating stack 110, the number of times the sacrificial layers NL1 to NL4 and the dielectric layers OL1 to OL4 are alternately stacked may be determined according to the number of memory cells. For example, when there are 48 vertically stacked memory cells, the sacrificial layers NL1 to NL4 and the dielectric layers OL1 to OL4 may be stacked 48 times, individually. The sacrificial layers NL1 to NL4 and the dielectric layers OL1 to OL4 may be repeatedly stacked in a direction that is perpendicular to the surface of the substrate 101.

The dielectric layers OL1 to OL4 may be deposited through a Chemical Vapor Deposition (CVD) method or an Atomic Layer Deposition (ALD) method. The sacrificial layers NL1 to NL4 may be deposited through a chemical vapor deposition method or an atomic layer deposition method.

The dielectric layers OL1 to OL4 and the sacrificial layers NL1 to NL4 may have the same thickness. The uppermost dielectric layer OL4 may be thicker than the other dielectric layers OL1 to OL3. The uppermost dielectric layer OL4 may be referred to as a dielectric cap layer.

Figure 4B:
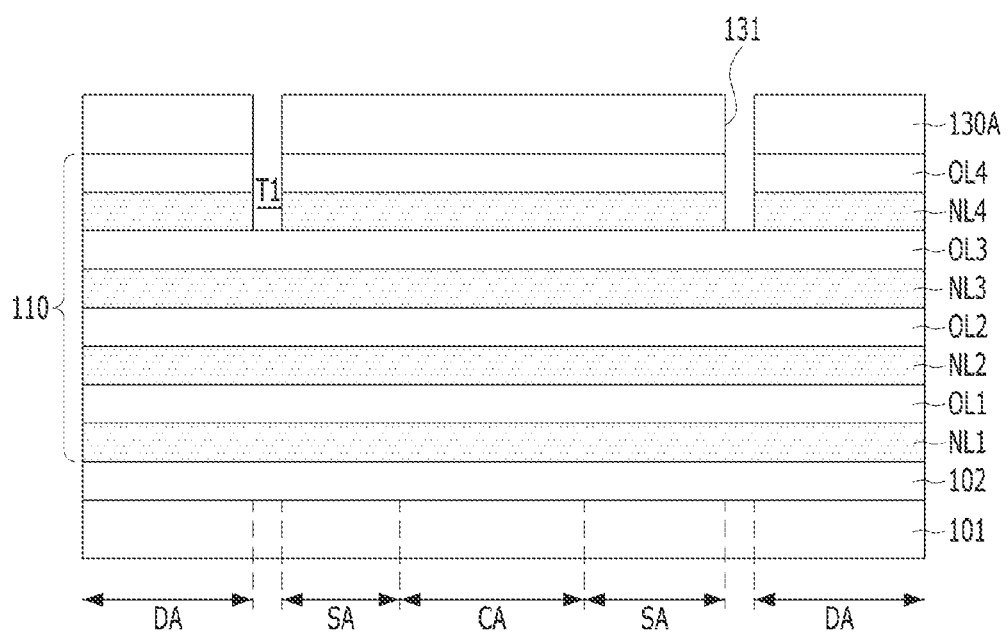
Figure 5A:
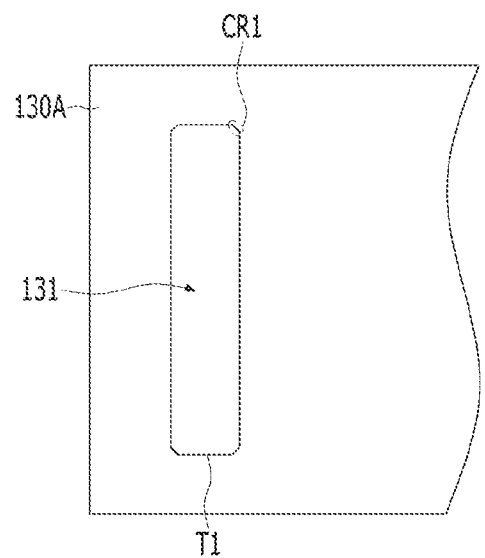
FIGS. 5A to 5D are plan views of photoresist patterns used for slimming and etching processes.

Referring to FIGS. 4B and 5A, a photoresist pattern 130A may be formed over the uppermost dielectric layer OL4. The photoresist pattern 130A may have a first opening 131. The uppermost dielectric layer OL4 and the sacrificial layer NL4 may be etched by using the photoresist pattern 130A. As a result, a first trench T1 to which the first opening 131 of the photoresist pattern 130A is transcripted may be formed. The dielectric layer OL3 below the first trench T1 may be exposed. From the perspective of a plan view of FIG. 5A, a corner of the first opening 131 of the photoresist pattern 130A and a corner of the first trench T1 may have the angled shape CR1. The angled corner of the first opening 131 and the angled corner of the first trench T1 may be abbreviated as a first angled corner portion CR1. The first angled corner portion CR1 may include a plurality of angled corners with an obtuse angle.

Figure 4C:
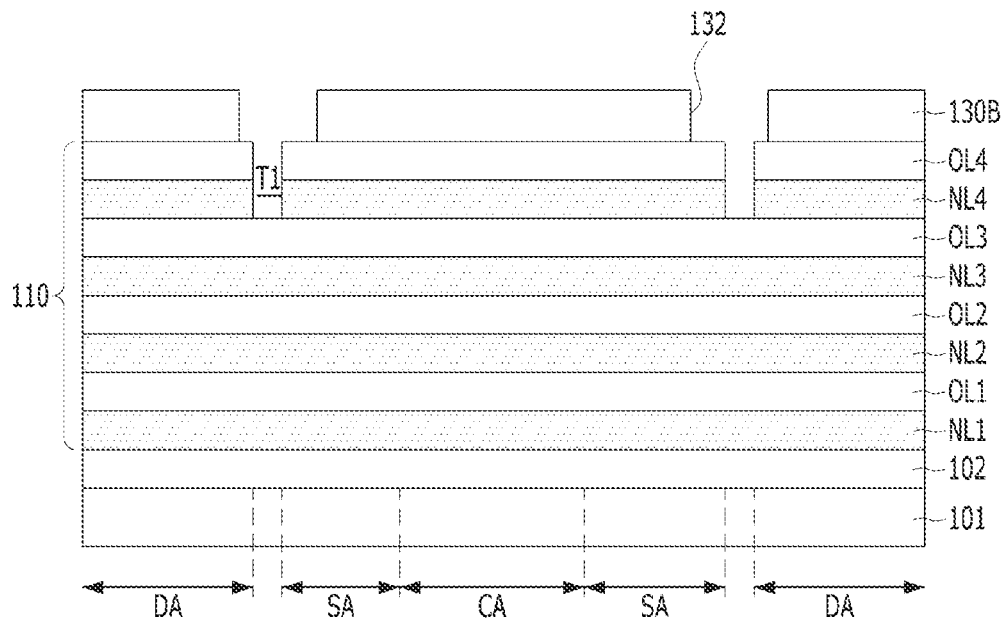
Figure 5B:
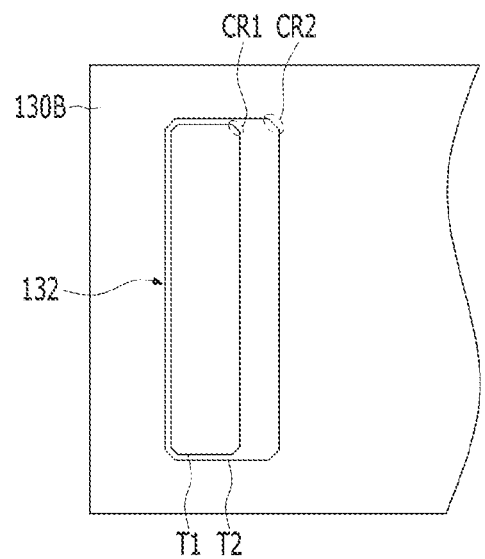

Referring to FIGS. 4C and 5B, a photoresist pattern 130B may be formed by slimming the photoresist pattern 130A. Oxygen plasma may be used to slim the photoresist pattern 130A. The photoresist pattern 130B may have a second opening 132. The uppermost dielectric layer OL4 and the sacrificial layer NL4 may be exposed again by the photoresist pattern 130B. In this case, the amount of slimming of the photoresist pattern 130B may be, for example, the same as the width of one step among the steps to be formed later. From the perspective of a plan view of FIG. 5B, the second opening 132 of the photoresist pattern 130B may include a second angled corner portion CR2.

Figure 4D:
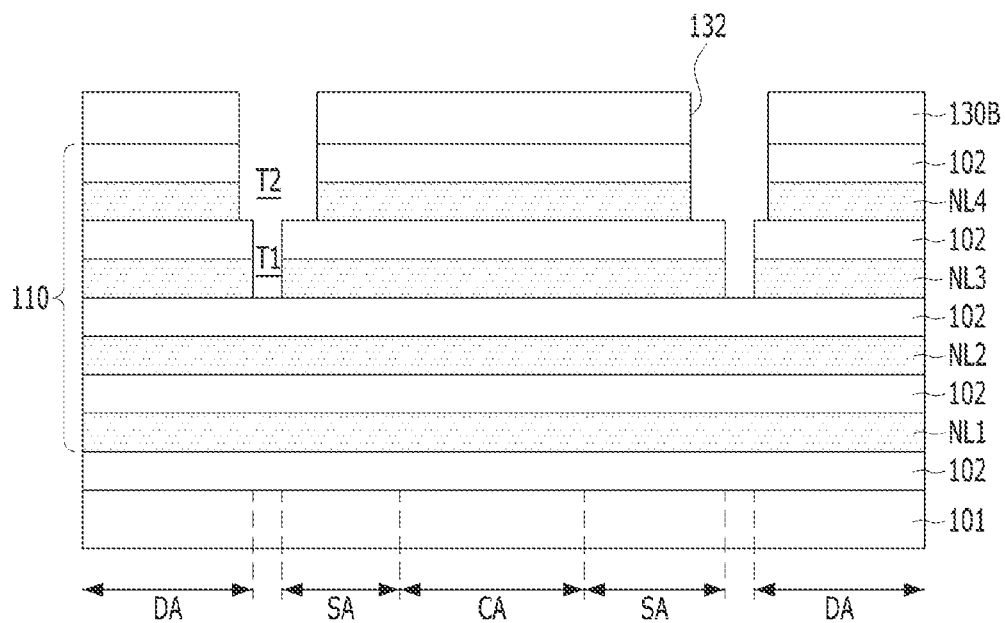

Referring to FIGS. 4D and 5B, the uppermost dielectric layer OL4 and the sacrificial layer NL4 may be etched by using the photoresist pattern 130B. As a result, a second trench T2 to which the second opening 132 of the photoresist pattern 130B is transcripted may be formed.

While the uppermost dielectric layer OL4 and the sacrificial layer NL4 are being etched, the dielectric layer OL3 and the sacrificial layer NL3 may be etched. Accordingly, the first trench T1, shown in FIG. 4C, may be transcripted to the dielectric layer OL3 and the sacrificial layer NL3.

A corner of the second opening 132 of the photoresist pattern 130B and a corner of the second trench T2 may include the angled corner portion CR2. The corner of the first trench T1 may include the first angled corner portion CR1.

Figure 4E:
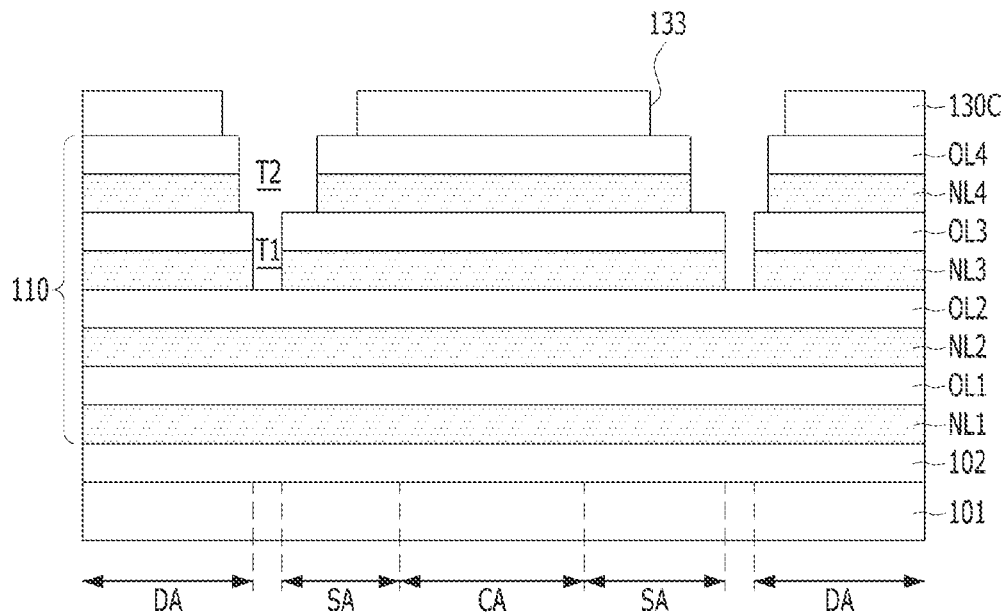
Figure 5C:
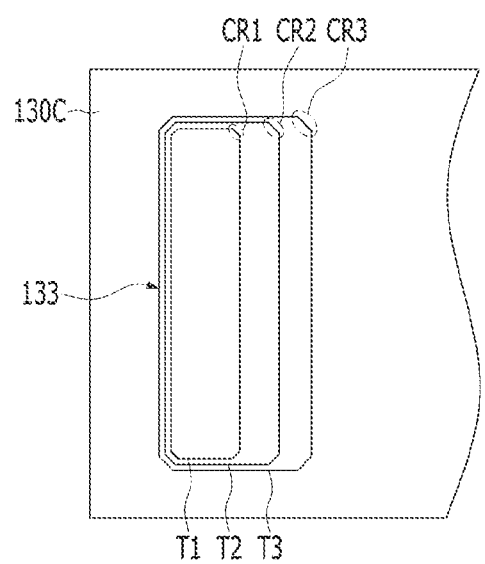

Referring to FIGS. 4E and 5C, the photoresist pattern 130C may be formed by slimming the photoresist pattern 130B. Oxygen plasma may be used to slim the photoresist pattern 130C. The photoresist pattern 130C may have a third opening 133. The uppermost dielectric layer OL4 and the sacrificial layer NL4 may be exposed again by the photoresist pattern 130C. In this case, the amount of slimming of the photoresist pattern 130C may be the same as, for example, the width of one step among the steps to be formed subsequently. From the perspective of a plan view of FIG. 5C, the third opening 133 of the photoresist pattern 130C may include the angled corner portion CR3.

Figure 4F:
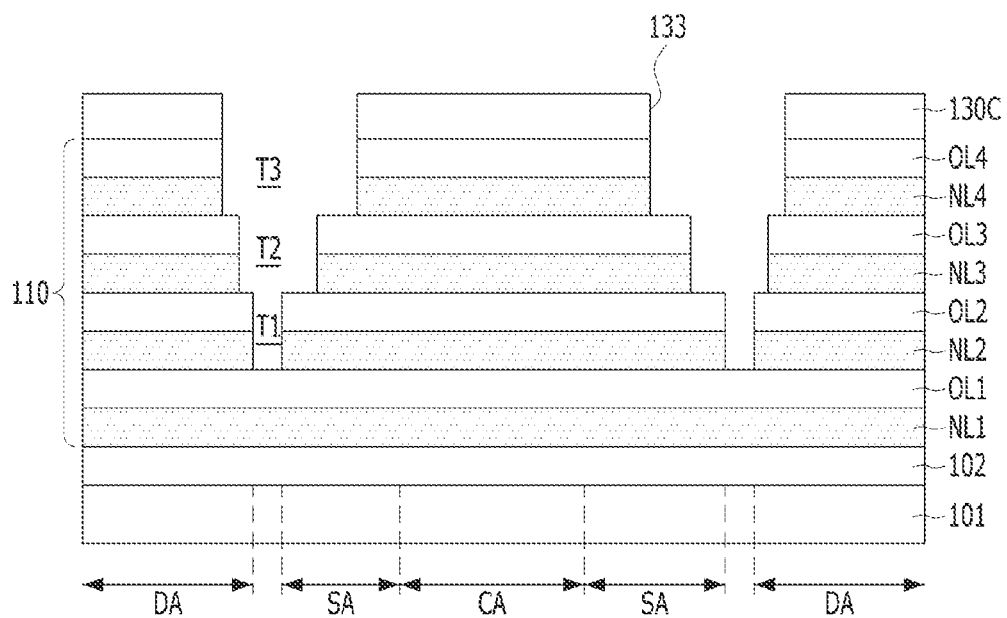

Referring to FIGS. 4F and 5C, the uppermost dielectric layer OL4 and the sacrificial layer NL4 may be etched by the photoresist pattern 130C. As a result, a third trench T3 to which the third opening 133 of the photoresist pattern 130C is transcripted may be formed.

While the uppermost dielectric layer OL4 and the sacrificial layer NL4 are being etched, the dielectric layer OL3 and the sacrificial layer NL3 may be etched. Accordingly, the second trench T2, shown in FIG. 4D, may be transcripted to the dielectric layer OL3 and the sacrificial layer NL3.

While the uppermost dielectric layer OL4 and the sacrificial layer NL4 are being etched, the dielectric layer OL2 and the sacrificial layer NL2 may be etched. Accordingly, the first trench T1, shown in FIG. 4D, may be transcripted to the dielectric layer OL2 and the sacrificial layer NL2.

A corner of the third opening 133 of the photoresist pattern 130C and a corner of the third trench T3 may include the angled corner portion CR3. The corner of the first trench T1 may include the angled corner portion CR1, and the corner of the second trench T2 may include the angled corner portion CR2.

Figure 4G:
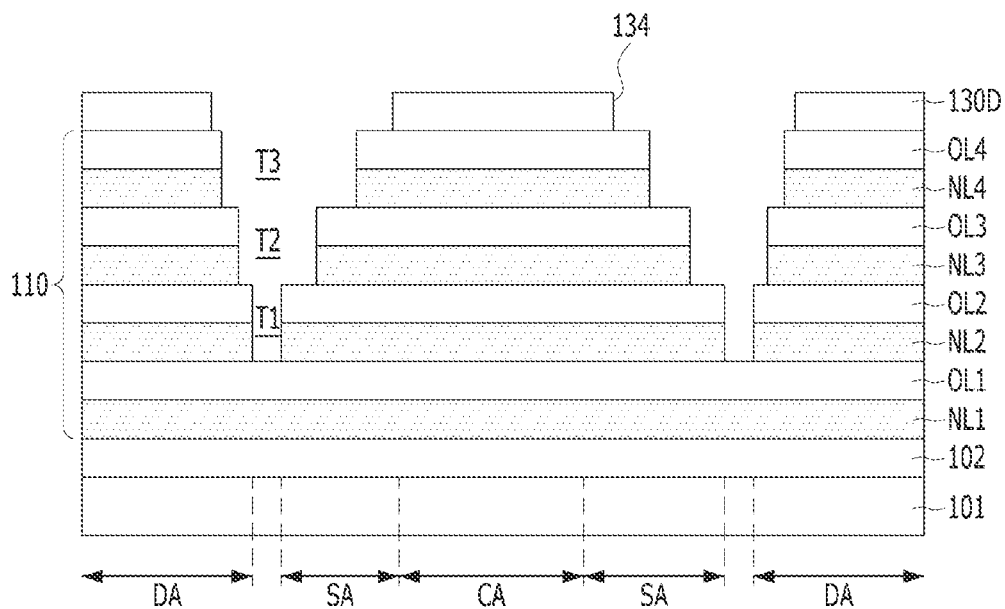
Figure 5D:
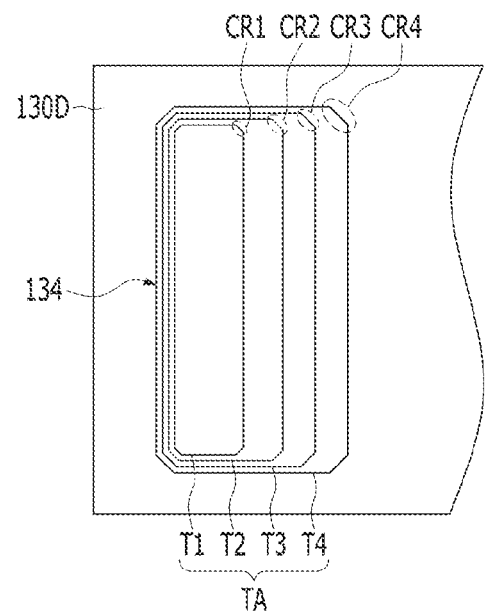

Referring to FIGS. 4G and 5D, the photoresist pattern 130D may be formed by slimming photoresist pattern 130C. Oxygen plasma may be used to slim the photoresist pattern 130D. The photoresist pattern 130D may have a fourth opening 134. The uppermost dielectric layer OL4 and the sacrificial layer NL4 may be exposed again by the photoresist pattern 130D. In this case, the amount of slimming of the photoresist pattern 130D is, for example, the same as the width of any one step of step portions formed later. From the perspective of a plan view of FIG. 5D, the fourth opening 134 of the photoresist pattern 130D may include an angled corner portion CR4.

Figure 4H:
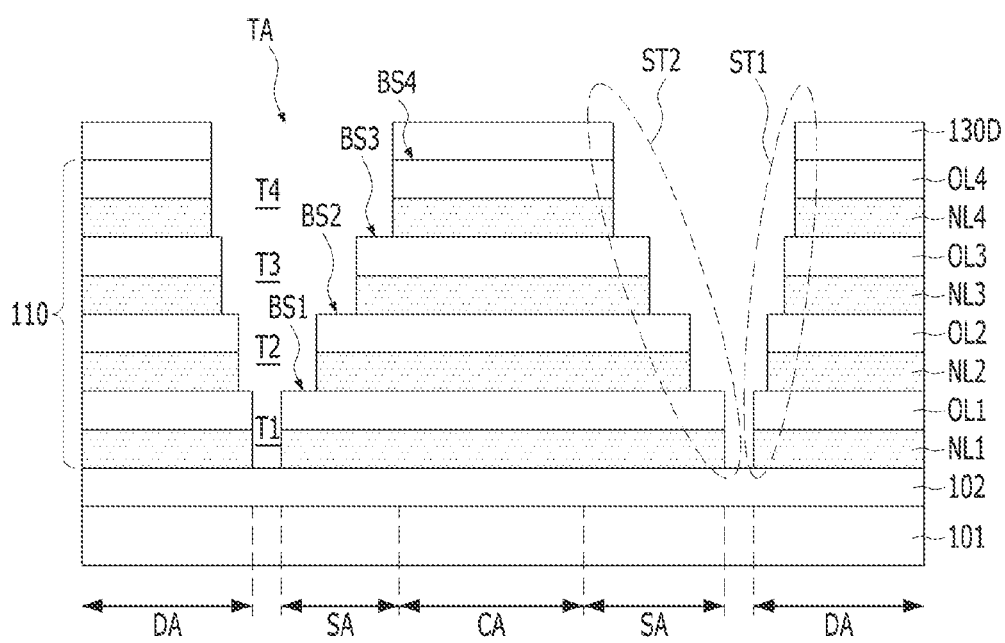

Referring to FIGS. 4H and 5D, the uppermost dielectric layer OL4 and the sacrificial layer NL4 may be etched by using the photoresist pattern 130D. As a result, a fourth trench T4 to which the fourth opening 134 of the photoresist pattern 130D is transcripted may be formed.

While the uppermost dielectric layer OL4 and the sacrificial layer NL4 are being etched, the dielectric layer OL3 and the sacrificial layer NL3 may be etched. Accordingly, the third trench T3 shown in FIG. 4F may be transcripted to the dielectric layer OL3 and the sacrificial layer NL3.

While the uppermost dielectric layer OL4 and the sacrificial layer NL4 are being etched, the dielectric layer OL2 and the sacrificial layer NL2 may be etched. Accordingly, the second trench T2 shown in FIG. 4F may be transcripted to the dielectric layer OL2 and the sacrificial layer NL2.

While the uppermost dielectric layer OL4 and the sacrificial layer NL4 are being etched, the dielectric layer OL1 and the sacrificial layer NL1 may be etched. Accordingly, the first trench T1 shown in FIG. 4F may be transcripted to the dielectric layer OL1 and the sacrificial layer NL1.

A corner of the fourth opening 134 of the photoresist pattern 130D and a corner of the fourth trench T4 may include an angled corner portion CR4. The corner of the first trench T1, the corner of the second trench T2, and the corner of the third trench T3 may include the angled corner portions CR1, CR2, and CR3, respectively.

As described above with reference to FIGS. 4B to 4H, the step-shaped trench TA may be formed by repeatedly performing the slimming and the etching processes. The step-shaped trench TA may penetrate the alternating stack 110. The step-shaped trench TA may include first and second step-shaped sidewalls ST1 and ST2 formed of a plurality of steps, and the first and second step-shaped sidewalls ST1 and ST2 may include a plurality of steps that descend toward the substrate 10. As illustrated in FIG. 2A, the step-shaped trench TA may further include a third sidewall and a fourth sidewall.

The step-shaped trench TA may be formed in the step-shaped areas SA, and the step-shaped areas SA and the dummy areas DA may be separated by the step-shaped trench TA. The slope of the first step-shaped sidewall ST1 and the slope of the second step-shaped sidewall ST2 may be asymmetrical to each other. The first step-shaped sidewall ST1 and the second step-shaped sidewall ST2 may have a shape facing each other and may have different step slopes. The steps of the first step-shaped sidewall ST1 may descend with a steeper slope than the steps of the second step-shaped sidewall ST2. The steps of the second step-shaped sidewall ST2 may descend with a smoother slope than the steps of the first step-shaped sidewall ST1. The occupied area of the second step-shaped sidewall ST2 may be larger than the occupied area of the first step-shaped sidewall ST1.

The first step-shaped sidewall ST1 and the second step-shaped sidewall ST2 may be coupled to each other to form an integrated bent step-shaped sidewall. The integrated bent step-shaped sidewall may be provided by a plurality of bent steps BS1 to BS4.

The step-shaped trench TA may include a plurality of trenches T1, T2, T3, and T4, and the trenches T1, T2, T3, and T4 may include angled corner portions CR1 to CR4, respectively. The trenches T1, T2, T3, and T4 may include a first trench T1, a second trench T2, a third trench T3, and a fourth trench T4. The second trench T2 may be positioned at a higher level than the first trench T1, and the third trench T3 may be positioned at a higher level than the second trench T2. The fourth trench T4 may be positioned at a higher level than the third trench T3. The width may gradually increase when moving from the first trench T1 to the fourth trench T4. The first trench T1 may have the smallest width, and the fourth trench T4 may have the largest width. The first trench T1 may define a first bent step BS1, and the second trench T2 may define a second bent step BS2. The third trench T3 may define a third bent step BS3, and the fourth trench T4 may define a fourth bent step BS4. The angled corner portions CR1 to CR4 of the trenches T1, T2, T3, and T4 may be referred to as angled corner portions CR1 to CR4 of the bent steps BS1 to BS4.

From the perspective of a plan view, corners of the trenches T1 to T4 may have angled corners CR1 to CR4. The angled corner portions CR to CR4 of the trenches T1 to T4 may be formed by transcribing the angled corner portions CR1 to CR4 of the photoresist patterns 130A to 130D. The angled corner portions CR1 to CR4 of the trenches T1 to T4 may include a plurality of obtuse angles.

The angled corner portion CR1 of the first trench T1 may be smaller in size than the angled corner portion CR2 of the second trench T2. The angled corner portion CR4 of the fourth trench T4 may be larger in size than the angled corner portion CR3 of the third trench T3. The angled corner portion CR3 of the third trench T3 may be larger in size than the angled corner portion CR2 of the second trench T2. In this way, the size of the angled corner portions CR1 to CR4 of the trenches T1 to T4 may gradually increase along the stacking direction (which is the vertical direction) of the alternating stack 110. Here, the size of the angled corner portions CR1 to CR4 may refer to the length. The length of the angled corner portion CR4 of the fourth trench T4 may be greater than the length of the angled corner portion CR3 of the third trench T3. The length of the angled corner portion CR3 of the third trench T3 may be greater than the length of the angled corner portion CR2 of the second trench T2. The length of the angled corner portion CR2 of the second trench T2 may be greater than the length of the angled corner portion CR1 of the first trench T1.

Figure 4I:
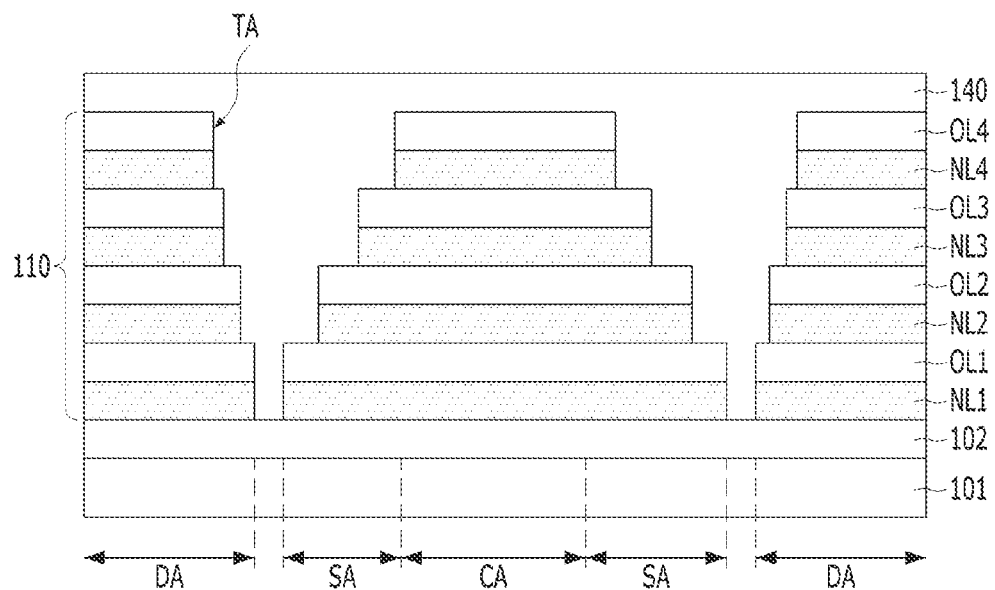

Referring to FIG. 4I, After removing the photoresist pattern 130D, an inter-layer dielectric layer 140 filling the step-shaped trench TA may be formed. The inter-layer dielectric layer 140 may include silicon oxide. The formation of a seam may be suppressed while the inter-layer dielectric layer 140 is being formed by the angled corner portions CR1 to CR4 of the trenches T1 to T4. The inter-layer dielectric layer 140 may be seam-free due to the angled corner portions CR1 to CR4 of the trenches T1 to T4.

As a comparative example, when the openings 131 to 134 of photoresist patterns 130A to 130D and the corners of the trenches T1 to T4 have a right angle or a curved shape, a seam may be formed during the formation of the inter-layer dielectric layer 140.

Figure 4J:
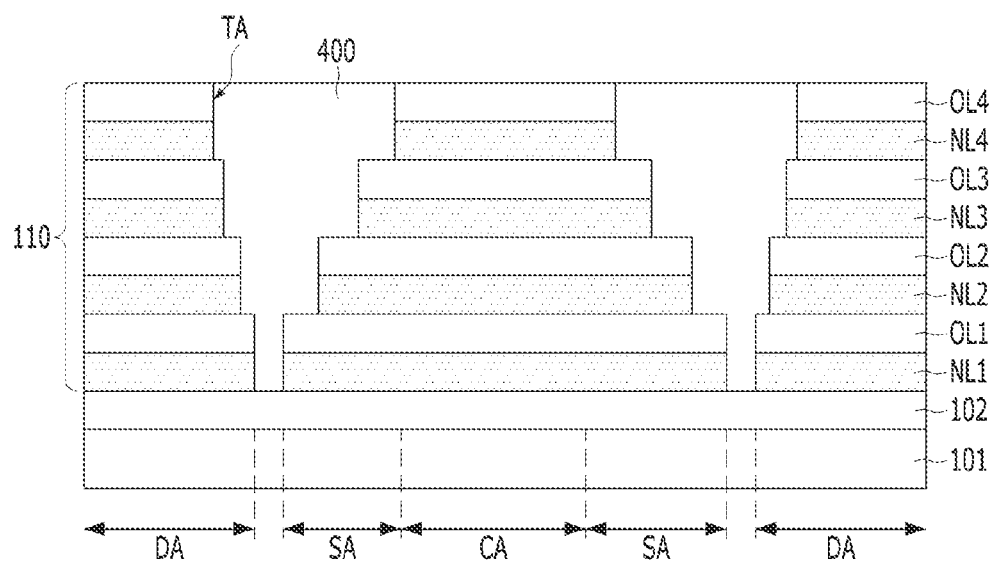

Referring to FIG. 4J, the inter-layer dielectric layer 140 may be planarized by a planarization process, such as Chemical Mechanical Polishing (CMP). The upper surface of the planarized inter-layer dielectric layer 400 may be positioned at the same level as the upper surface of the uppermost dielectric layer OL4.

Figure 4K:
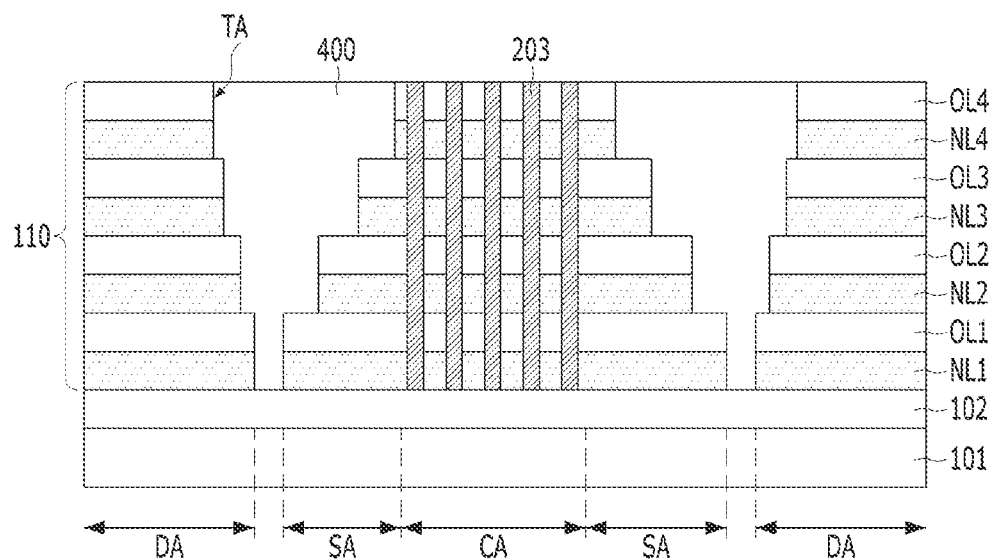

Referring to FIG. 4K, a plurality of vertical channel structures 203 penetrating the alternating stack 110 may be formed. The vertical channel structure 203 may extend in the vertical direction from the surface of the substrate 101. The vertical channel structure 203 may penetrate the dielectric layers OL1 to OL4 and the sacrificial layers NL1 to NL4, and it may extend in the stacking direction of the dielectric layers OL1 to OL4 and the sacrificial layers NL1 to NL4. For a detailed description on the vertical channel structure 203, the vertical channel structure 203 shown in FIGS. 1A to 1C may be referred to.

Subsequently, referring to FIGS. 4L and 4M, a process of replacing the sacrificial layers NL1 to NL4 with the gate electrodes 201 may be performed.

Figure 4L:
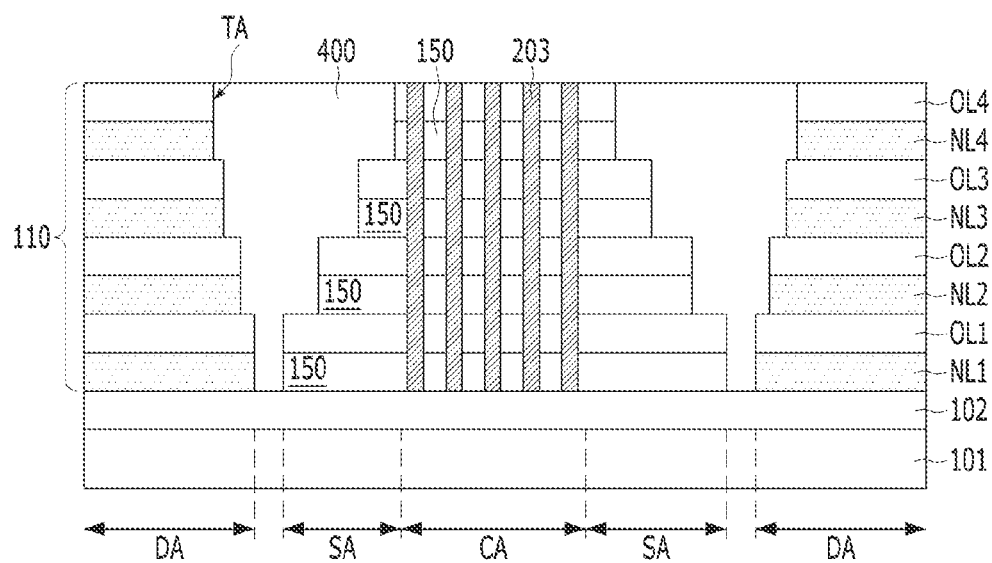

Referring to FIG. 4L, lateral recesses 150 may be formed by selectively removing some of the sacrificial layers NL1 to NL4 in the central area CA of the alternating stack 110. The lateral recesses 150 may be formed in the central area CA and the step-shaped areas SA of the alternating stack 110. The lateral recesses 150 may extend laterally from the central area CA to the step-shaped areas SA. The lateral recesses 150 may partially expose the sidewalls of the vertical channel structure 203. Although not illustrated, in order to form the lateral recesses 150, a portion of the alternating stack 110 may be etched to form a vertical trench (not shown), and some of the sacrificial layers NL1 to NL4 may be removed through the vertical trench. Here, the vertical trench may refer to a space in which the slit 300 of FIG. 1A is to be formed. In order to form the slit 300, the gate electrodes 201 may be formed and then the vertical trench may be filled with a dielectric material.

Figure 4M:
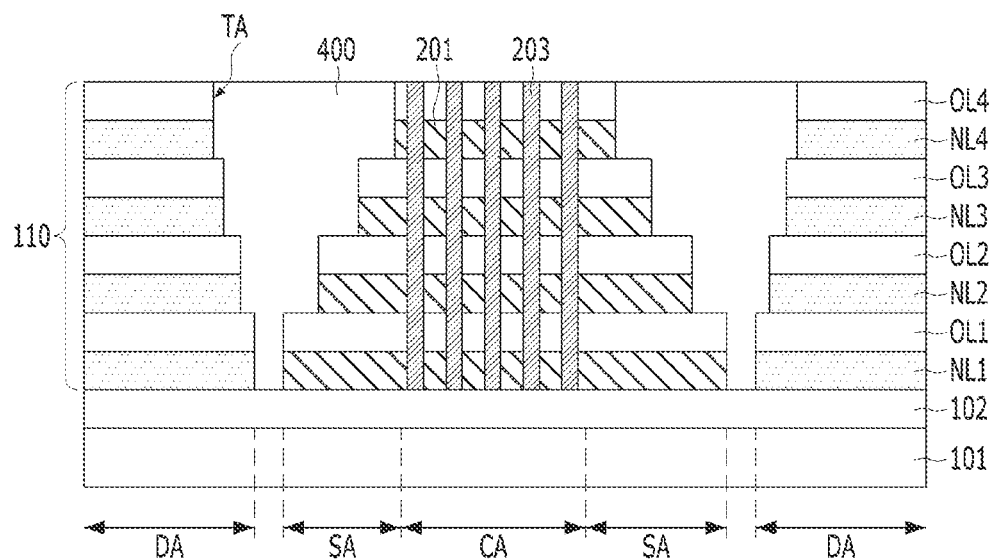

Referring to FIG. 4M, gate electrodes 201 may be formed to fill the lateral recesses 150. To form the gate electrodes 201, a conductive material filling the lateral recesses (see 150 in FIG. 4L) may be deposited, and then the conductive material may be selectively etched. The gate electrodes 201 may include polysilicon, a metal, a metal nitride, a metal silicide, or a combination thereof. The gate electrodes 201 may include titanium nitride, tungsten, or a stack of titanium nitride and tungsten.

The gate electrodes 201 may extend from the central area CA to the step-shaped areas SA. The edges of the gate electrodes 201 positioned in the step-shaped areas SA may become gate pads (see 201P in FIG. 1A).

An alternating stack of the gate electrodes 201 and the dielectric layers OL1 to OL4 may be formed in the central area CA. Also, an alternating stack of residual sacrificial layers NL1 to NL4 and the dielectric layers OL1 to OL4 may be formed in the dummy area DA.

According to another embodiment of the present invention, an alternating stack of the gate electrodes 201 and the dielectric layers OL1 to OL4 may be formed in the dummy area DA as well. In this case, the lateral recesses 150 of FIG. 4L may be formed in the dummy area DA, too, and the lateral recesses 150 formed in the dummy area DA may be filled with the gate electrodes 201. The gate electrodes 201 formed in the dummy area DA may be referred to as dummy gate electrodes.

Subsequently, as illustrated in FIGS. 1A and 1B, contact plugs 500 may be formed to be respectively coupled to the gate pads 201P of the gate electrodes 201. The contact plugs 500 may penetrate the inter-layer dielectric layer 400 and the dielectric layers OL1 to OL4 to be respectively coupled to the gate pads 201P of the gate electrodes 201.

Figure 6:
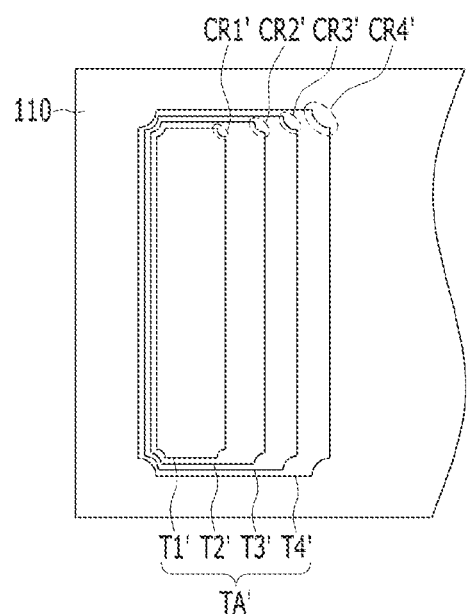
FIG. 6 illustrates a step-shaped trench in accordance with another embodiment of the present invention in a plane view.

FIG. 6 illustrates a step-shaped trench in accordance with another embodiment of the present invention in a plan view. The step-shaped trench TA' of FIG. 6 is a modified example of the step-shaped trench TA shown in FIGS. 4H and 5D.

Referring to FIG. 6, the step-shaped trench TA' penetrating the alternating stack 110 may include a plurality of trenches T1', T2', T3', and T4', and each of the trenches T1', T2', T3', and T4' may include concaved corner portions CR1' to CR4'. The trenches T1', T2', T3', and T4' may include a first trench T1', a second trench T2', a third trench T3', and a fourth trench T4'. The second trench T2' may be positioned at a higher level than the first trench T1', and the third trench T3' may be positioned at a higher level than the second trench T2'. The fourth trench T4' may be positioned at a higher level than the third trench T3'. The first trench T1' may have the smallest width, and the fourth trench T4' may have the largest width.

The concaved corner portions CR1' to CR4' may refer to acute angled corners. The angled corner portion CR1' of the first trench T1' may be smaller in size than the angled corner portion CR2' of the second trench T2'. The angled corner portion CR4' of the fourth trench T4' may be larger in size than the angled corner portion CR3' of the third trench T3'. The angled corner portion CR3' of the third trench T3' may be larger in size than the angled corner portion CR2' of the second trench T2'.

As described above, the size of the angled corner portions CR1' to CR4' of the trenches T1' to T4' may gradually increase along the stacking direction of the alternating stack 110. The radius of curvature of the angled corner portion CR4' of the fourth trench T4' may be larger than the radius of curvature of the angled corner portion CR3' of the third trench T3'. The radius of curvature of the angled corner portion CR3' of the third trench T3' may be greater than the radius of curvature of the angled corner portion CR2' of the second trench T2'. The radius of curvature of the angled corner portion CR2' of the second trench T2' may be greater than the radius of curvature of the angled corner portion CR1' of the first trench T1'. The acute angled corner portions CR1' to CR4' may include a concave portion and a sharp point defined at both ends of the concave portion. The acute angled corner portions CR1' to CR4' may be different from a curved shape, and there may be a limitation in suppressing the formation of a seam in the inter-layer dielectric layer by the curved corners.

In order to form the angled corner portions CR1' to CR4' of the trenches T1' to T4', the openings 131 to 134 of the photoresist patterns 130A to 130D as described in FIGS. 5A to 5D may be formed to have concaved corner portions.

The angled corner portions CR1' to CR4' of the trenches T1' to T4', as described above, may suppress the formation of a seam during the deposition process of the inter-layer dielectric layer 140 shown in FIG. 4I.

According to the above-described embodiments, as the step-shaped trenches TA and TA' are formed to have angled corner portions CR1 to CR4 and CR1' to CR4', the formation of a seam in the inter-layer dielectric layer 140 may be suppressed. Since the inter-layer dielectric layer 140 is formed without any seam, the step-shaped trenches TA and TA' may prevent cracks in the angled corner portions CR1 to CR4 and CR1' to CR4'.

The angled corner portions CR1 to CR4 and CR1' and CR4' of the step-shaped trenches TA and TA' may be applied to a three-dimensional (3D) NAND. Although the number of layers of a memory cell is increased, it is possible to prevent cracks that may be caused by the seam in the inter-layer dielectric layer in the corners of the step-shaped area.

Figure 7:
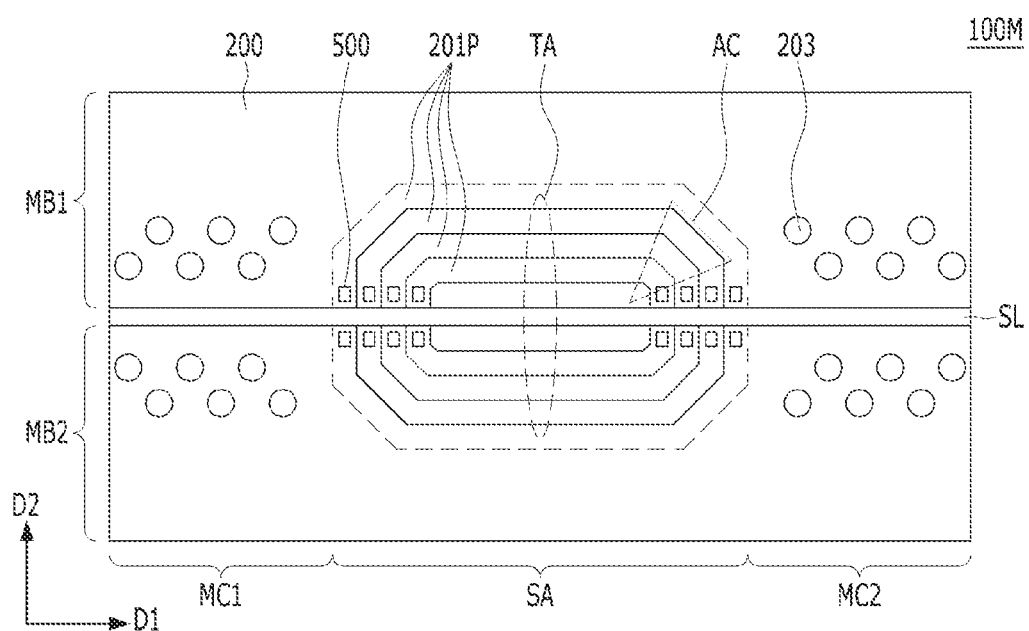
FIG. 7 is a plan view illustrating a semiconductor memory device in accordance with another embodiment of the present invention.

FIG. 7 is a plan view illustrating a semiconductor memory device 100M in accordance with another embodiment of the present invention.

Referring to FIG. 7, the semiconductor memory device 100M may include a first gate electrode stack MB1 and a second gate electrode stack MB2. The first gate electrode stack MB1 and the second gate electrode stack MB2 may be spaced apart from each other by a slit SL. Each of the first gate electrode stack MB1 and the second gate electrode stack MB2 may include a first cell area MC1, a second cell area MC2, and a step-shaped area SA between the first cell area MC1 and the second cell area MC2. According to the embodiment of the present invention, a case where there is one step-shaped area SA is shown. However, according to another embodiment of the present invention, the step-shaped area SA may be divided into two or more areas that are arranged in a row along the first direction D1. The first gate electrode stack MB1 may be formed in the first memory block, and the second gate electrode stack MB2 may be formed in the second memory block. The first gate electrode stack MB1 and the second gate electrode stack MB2 may face each other in the second direction D2 with the slit SL between them.

Each of the first gate electrode stack MB1 and the second gate electrode stack MB2 may correspond to the alternating stack 200 of FIG. 1A. Accordingly, each of the first gate electrode stack MB1 and the second gate electrode stack MB2 may include a stack of the gate electrodes 201. The vertical channel structures 203 may penetrate the first gate electrode stack MB1 and the second gate electrode stack MB2.

Each of the first gate electrode stack MB1 and the second gate electrode stack MB2 may include vertically stacked gate pads 201P. The gate pads 201P of the first gate electrode stack MB1 and the second gate electrode stack MB2 may have the same size. The gate pads 201P may be positioned in the step-shaped area SA, and the gate pads 201P may be formed to have a step-shaped structure through a step-shaped trench TA. The gate pads 201P may have a '∩'-shaped planar structure, and each of the gate pads 201P may include angled sidewalls AC. The angled sidewalls AC may include obtuse angled corners. According to another embodiment of the present invention, angled sidewalls AC may include acute angled corners.

Contact plugs 500 may be coupled to the gate pads 201P, respectively.

According to the embodiment of the present invention, the seam in the inter-layer dielectric layer filling a step-shaped trench may be prevented by forming the step-shaped trench to have angled corners.

According to the embodiment of the present invention, since the gate pads include angled corners, an inter-layer dielectric layer without a seam may be formed.

According to the embodiment of the present invention, the reliability of a vertical NAND may be improved.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
a gate electrode stack vertically stacked over a substrate with bent gate pads, the bent gate pads of the gate electrode stack having a step-shaped structure;
an inter-layer dielectric layer covering the bent gate pads; and
a plurality of contact plugs respectively coupled to the bent gate pads by penetrating the inter-layer dielectric layer,
wherein the bent gate pads include angled corner portions of different sizes in a plan view, the sizes of the angled corner portions progressively changing based on a depth of the bent gate pads in a cross-sectional view,
wherein the inter-layer dielectric layer is seam-free due to the angled corner portions.

2. The semiconductor memory device of claim 1,
wherein the angled corner portions of the bent gate pads have different lengths, and
wherein the angled corner portions progressively decrease in length going from an uppermost bent gate pad to a lowermost bent gate pad.

3. The semiconductor memory device of claim 1,
wherein each of the angled corner portions of the bent gate pads includes a plurality of angled corners, and
wherein the angled corners have obtuse angles.

4. The semiconductor memory device of claim 1,
wherein each of the angled corner portions of the bent gate pads includes a plurality of angled corners, and
wherein the angled corners have acute angles.

5. The semiconductor memory device of claim 1,
wherein the angled corner portions of the bent gate pads do not overlap with each other in a stacking direction of the bent gate pads.

6. The semiconductor memory device of claim 1, further comprising:
a plurality of vertical channel structures penetrating the gate electrode stack.

7. A semiconductor memory device, comprising:
a substrate;
an alternating stack in which a plurality of dielectric layers and a plurality of conductive layers are alternately stacked in a direction that is perpendicular to a surface of the substrate;
a step-shaped trench penetrating the alternating stack, the step-shaped trench including a plurality of trenches that extend vertically toward the substrate; and
an inter-layer dielectric layer filling the step-shaped trench,
wherein the plurality of trenches include angled corner portions of different sizes in a plane view, the sizes of the angled corner portions progressively changing based on a depth of the plurality of trenches in a cross-sectional view,
wherein the inter-layer dielectric layer is seam-free due to the angled corner portions.

8. The semiconductor memory device of claim 7,
wherein the angled corner portions of the trenches have different lengths, and
wherein the angled corner portions progressively decrease in length going from an uppermost trench to a lowermost trench.

9. The semiconductor memory device of claim 7,
wherein each of the angled corner portions of the trenches includes a plurality of angled corners, and
wherein the angled corners have obtuse angles.

10. The semiconductor memory device of claim 7,
wherein each of the angled corner portions of the trenches includes a plurality of angled corners, and
wherein the angled corners have acute angles.

11. The semiconductor memory device of claim 7,
wherein the angled corner portions of the trenches do not overlap with each other in a depth direction of the trenches.

12. The semiconductor memory device of claim 7,
wherein each of the conductive layers includes a bent step that is exposed by the step-shaped trench, and
wherein the bent steps have angled corners respectively corresponding to the angled corner portions of the step-shaped trench in the plane view.

13. The semiconductor memory device of claim 12, further comprising:
a plurality of vertical channel structures penetrating the conductive layers; and
a plurality of contact plugs respectively coupled to the bent steps by penetrating the inter-layer dielectric layer.

* * * * *